US009859413B2

(12) United States Patent
Okita et al.

(10) Patent No.: US 9,859,413 B2
(45) Date of Patent: Jan. 2, 2018

(54) NITRIDE SEMICONDUCTOR DEVICE AND METHOD OF MANUFACTURING THE SAME

(71) Applicant: PANASONIC INTELLECTUAL PROPERTY MANAGEMENT CO., LTD., Osaka (JP)

(72) Inventors: Hideyuki Okita, Toyama (JP); Masahiro Hikita, Toyama (JP); Hisayoshi Matsuo, Toyama (JP); Yasuhiro Uemoto, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/399,443

(22) Filed: Jan. 5, 2017

(65) Prior Publication Data

US 2017/0117403 A1     Apr. 27, 2017

Related U.S. Application Data

(63) Continuation of application No. PCT/JP2015/003388, filed on Jul. 6, 2015.

(30) Foreign Application Priority Data

Jul. 11, 2014  (JP) .................. 2014-142917

(51) Int. Cl.
*H01L 29/778* (2006.01)
*H01L 29/423* (2006.01)
(Continued)

(52) U.S. Cl.
CPC ...... *H01L 29/7787* (2013.01); *H01L 29/0642* (2013.01); *H01L 29/42356* (2013.01); *H01L 29/66462* (2013.01)

(58) Field of Classification Search
None
See application file for complete search history.

(56) References Cited

U.S. PATENT DOCUMENTS 9,419,125 B1 * 8/2016 Schultz ............... H01L 29/207
2009/0146182 A1   6/2009 Hikita et al.
(Continued)

FOREIGN PATENT DOCUMENTS

JP   2009-141244 A   6/2009
JP   2011-077386 A   4/2011
(Continued)

OTHER PUBLICATIONS

International Search Report and Written Opinion, issued in International Patent Application No. PCT/JP2015/003388, dated Sep. 15, 2015; with parital Engish translation.

*Primary Examiner* — Alia Sabur
(74) *Attorney, Agent, or Firm* — McDermott Will & Emery LLP (57) ABSTRACT

A nitride semiconductor device including a substrate, a channel layer, a carbon-poor barrier layer having a recess, a carbon-rich barrier layer disposed over the recess and the carbon-poor barrier layer, and a gate electrode above the recess, wherein the carbon-poor and carbon-rich barrier layers have bandgaps larger than that of the channel layer, the upper surface of the carbon-rich barrier layer includes a first main surface including a source electrode and a drain electrode, and a bottom surface of a depression disposed along the recess, and side surfaces of the depression connecting the first main surface to the bottom surface of the depression, and among edges of the depression of the carbon-rich barrier layer which are boundaries between the first main surface and the side surfaces of the depression, the edge of the depression of the carbon-rich barrier layer
(Continued)

closest to the drain electrode is covered with the gate electrode.

12 Claims, 7 Drawing Sheets

(51) Int. Cl.
    *H01L 29/66*     (2006.01)
    *H01L 29/06*     (2006.01)

(56) References Cited

U.S. PATENT DOCUMENTS

| | | |
|---|---|---|
| 2011/0037100 A1 | 2/2011 | Hikita et al. |
| 2011/0210378 A1 | 9/2011 | Ueno et al. |
| 2012/0112202 A1* | 5/2012 | Hwang ............... H01L 29/7787 257/76 |
| 2013/0093006 A1 | 4/2013 | Senda et al. |
| 2013/0134443 A1 | 5/2013 | Terano et al. |
| 2014/0008661 A1 | 1/2014 | Iwami et al. |
| 2014/0097468 A1 | 4/2014 | Okita et al. |
| 2014/0183545 A1* | 7/2014 | Hoke ................ H01L 29/66462 257/76 |

FOREIGN PATENT DOCUMENTS

| | | |
|---|---|---|
| JP | 2011-082415 A | 4/2011 |
| JP | 2013-008836 A | 1/2013 |
| JP | 2013-089673 A | 5/2013 |
| JP | 2013-115362 A | 6/2013 |
| JP | 2014-017285 A | 1/2014 |
| WO | 2013/008422 A1 | 1/2013 |

* cited by examiner

NITRIDE SEMICONDUCTOR DEVICE AND METHOD OF MANUFACTURING THE SAME

CROSS REFERENCE TO RELATED APPLICATIONS

This application is a U.S. continuation application of PCT International Patent Application Number PCT/JP2015/003388 filed on Jul. 6, 2015, claiming the benefit of priority of Japanese Patent Application Number 2014-142917 filed on Jul. 11, 2014, the entire contents of which are hereby incorporated by reference.

BACKGROUND

1. Technical Field

This disclosure relates to nitride semiconductor devices, and particularly relates to devices including Group III nitride semiconductors which can be used as power transistors.

2. Description of the Related Art

Group III nitride semiconductors, particularly GaN and AlGaN have wide bandgaps, and thus high dielectric breakdown voltage. The Group III nitride semiconductors can readily form hetero-structures such as AlGaN/GaN. An AlGaN layer and a GaN layer generate a channel of electrons in a high concentration (two-dimensional electrons gas, 2DEG) close to the GaN layer at the interface between AlGaN and GaN because of piezo charges and a difference in bandgap between AlGaN and GaN, which are generated from a difference in lattice constant between AlGaN and GaN. Such a mechanism enables operation at large current and high speed. A device operated as an FET through control of the 2DEG channel typically refers to a high electron mobility transistor (HEMT). These properties lead to applications of the Group III nitride semiconductors to electronic devices such as power transistors such as field effect transistors (such as FET, HEMT, and HFET) and diodes.

Group III nitride semiconductors used in the power FETs have problems in gate leakage current and current collapse.

Although the gate leakage current generally refers to current flowing between a gate and a drain or between a gate and a source, the gate leakage current used in this specification is defined as a current flowing between a gate and a drain when an FET is off. The gate leakage current flowing when the FET is off has mainly three routes: (1) 2DEG leakage from the gate through 2DEG, (2) surface leak flowing from the gate through the surface of the semiconductor, and (3) barrier leak flowing from the gate through the inside a barrier layer. Besides, the gate leakage current includes substrate leak flowing between the gate and the substrate earthed. The substrate leakage will not be discussed in this specification.

Current collapse (or current slump) refers to a phenomenon generated by electrons trapped at a surface level of a semiconductor, an impurity level, or a level caused by crystal defects. Current collapse occurs as follows: The electrons trapped at one of these levels when the FET is on or off remain at the level to form a depletion layer around the level, inhibiting the drain current which should flow when the FET is on. In particular, carbon (hereinafter, referred to as C) is a known major cause to generate current collapse since carbon (hereinafter, also referred to as C) generates a deep impurity level, and electrons once trapped in such a deep level are difficult to get out from the level. Crystal growth of the Group III nitride semiconductors is typically performed by organic metal chemical vapor deposition (MOCVD). For this reason, carbon contained in the organic raw material such as trimethylgallium (TMG) or trimethylaluminum (TMA) is readily taken into crystals during the crystal growth depending on the conditions for growth.

Figure 1:
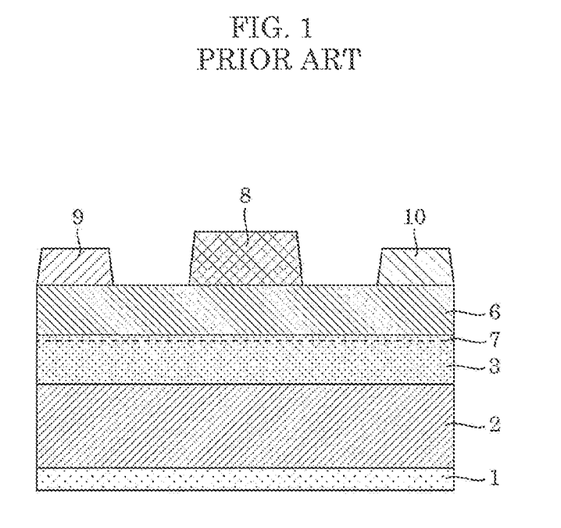
FIG. 1 is a sectional view illustrating a structure of an FET disclosed in Japanese Unexamined Patent Application Publication No. 2013-008836.

FIG. 1 is a sectional view illustrating a structure of an FET disclosed in Japanese Unexamined Patent Application Publication No. 2013-008836. A substrate 1, a buffer layer 2, a channel layer 3 (such as GaN), and a carbon-rich or C-rich barrier layer 6 (such as AlGaN) having a bandgap larger than that of the channel layer 3 are disposed in sequence. In such a structure, a 2DEG layer 7 is generated by the difference in bandgap between the C-rich barrier layer 6 and the channel layer 3 and piezo charges in the C-rich barrier layer 6. A gate electrode 8 is disposed on the C-rich barrier layer 6, and a source electrode 9 and a drain electrode 10 in ohmic contact with each other are disposed on opposing sides of the gate electrode 8 and spaced from the gate electrode 8. The gate electrode 8 is in schottky contact with the C-rich barrier layer 6. According to Japanese Unexamined Patent Application Publication No. 2013-008836, a predetermined concentration of carbon added to the C-rich barrier layer 6 can reduce the gate leakage current, and can produce an FET having reduced current collapse.

Figure 2:
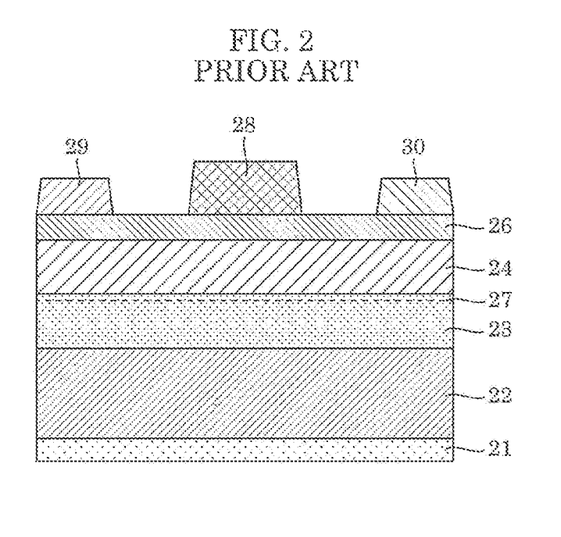
FIG. 2 is a sectional view illustrating a structure of an FET disclosed in Japanese Unexamined Patent Application Publication No. 2014-017285.

FIG. 2 is a sectional view illustrating a structure of an FET disclosed in Japanese Unexamined Patent Application Publication No. 2014-017285. A substrate 21, a buffer layer 22, a channel layer 23 (such as GaN), and a carbon-poor or C-poor barrier layer 24 (such as AlGaN) having a bandgap larger than that of the channel layer 23 are disposed in sequence. A C-rich barrier layer 26 (such as AlGaN) containing a high concentration of carbon added by a known ion injection technique is disposed on the surface of the channel layer 23. A 2DEG layer 27 is generated in the channel layer 23 near to the interface of the C-poor barrier layer 24. A gate electrode 28 is disposed on the C-rich barrier layer 26, and a source electrode 29 and a drain electrode 30 in ohmic contact with each other are disposed on opposing sides of the gate electrode and spaced from the gate electrode 28. The gate electrode 28 is in schottky contact with the C-rich barrier layer 26. According to Japanese Unexamined Patent Application Publication No. 2014-017285, a relatively high concentration of carbon added to the C-rich barrier layer 26 can reduce the gate leakage current, and can produce an FET having reduced current collapse because no C-rich layer is disposed near the channel.

Figure 3:
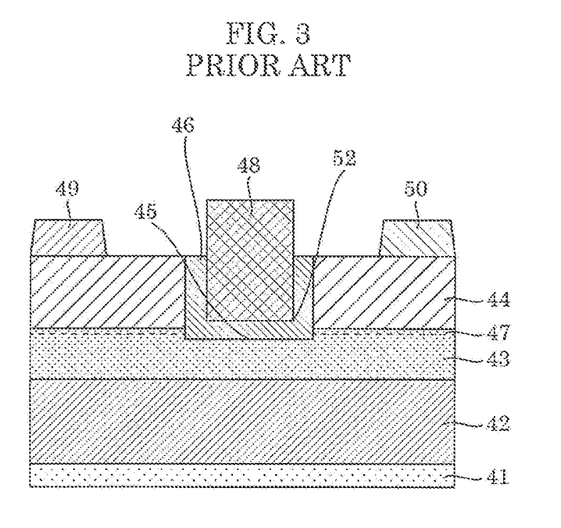
FIG. 3 is a sectional view illustrating a structure in which a structure disclosed in Japanese Unexamined Patent Application Publication No. 2013-115362 is applied to an FET.

FIG. 3 is a sectional view illustrating a structure to which a diode structure disclosed in Japanese Unexamined Patent Application Publication No. 2013-115362 is applied to an FET structure. A substrate 41, a buffer layer 42, a channel layer 43 (such a GaN), and a C-poor barrier layer 44 (such as AlGaN) having a bandgap larger than that of the channel layer 43 are disposed in sequence. A recess 45 penetrating through the C-poor barrier layer 44 into the channel layer 43 is disposed, and a C-rich barrier layer 46 (such as AlGaN) is disposed such that the recess 45 is filled with the C-rich barrier layer 46. A 2DEG layer 47 is generated in the channel layer 43 near the interface of the C-poor barrier layer 44. A gate electrode 48 is disposed such that the depression of the C-rich barrier layer 46 (such as AlGaN) is filled with the gate electrode 48, and a source electrode 49 and a drain electrode 50 in ohmic contact with each other are disposed on opposing sides of the gate electrode 48 and spaced from the gate electrode 48. The gate electrode 48 is in schottky contact with the C-rich barrier layer 46. According to Japanese Unexamined Patent Application Publication No. 2013-115362, a relatively high concentration of carbon added to the C-rich barrier layer 46 can reduce the gate leakage current.

Unfortunately, the semiconductor devices described in Technical Field have several problems in application to the field of the power transistor.

The power transistor requires normally-off operation in which the drain current does not flow at a gate voltage of the semiconductor device of 0 V (also referred to as an enhancement-mode operation) in view of the safety of apparatuses and devices on which the power transistor is mounted. The power transistor requires a very low gate leakage current. A general-purpose power semiconductor device having a rating of 600 V should not cause current collapse at 600 V.

The structure disclosed in Japanese Unexamined Patent Application Publication No. 2013-008836, however, should have a sufficiently thin C-rich barrier layer 6 (for example, composed of 25% Al composition and having a thickness of about 5 nm) to attain a power transistor operating in a normally-off mode. A reduction in thickness of the C-rich barrier layer 6 results in an arrangement of the channel disposed closer to the surface of the semiconductor, significantly generating current collapse due to electrons trapped at the surface level. Moreover, a predetermined concentration of carbon is added to the C-rich barrier layer 6. For this reason, the carbon contained in the C-rich barrier layer 6 disposed on the channel layer 3 causes trapping of electrons at an impurity level derived from the carbon contained in the C-rich barrier layer 6, significantly generating current collapse. Accordingly, the structure disclosed in Japanese Unexamined Patent Application Publication No. 2013-008836 cannot prevent generation of current collapse at a drain voltage of 600 V.

Similarly to the structure disclosed in Japanese Unexamined Patent Application Publication No. 2013-008836, the C-poor barrier layer 24 and the C-rich barrier layer 26 in the structure disclosed in Japanese Unexamined Patent Application Publication No. 2014-017285 should also have a sufficiently thin total thickness (for example, composed of 25% Al composition and having a thickness of about 5 nm) to attain a power transistor operating in a normally-off mode. A reduction in thickness of the C-poor barrier layer 24 and that of the C-rich barrier layer 26 results in the channel disposed closer to the surface of the semiconductor, significantly generating current collapse due to electrons trapped at the surface level. Accordingly, the structure disclosed in Japanese Unexamined Patent Application Publication No. 2014-017285 cannot have the compatibility between the achievement of the normally-off operation and prevention in current collapse generated at 600 V. Note that unlike the structure disclosed in Japanese Unexamined Patent Application Publication No. 2013-008836, the C-rich barrier layer 26 is disposed above the channel layer 23 without contacting the channel layer. Such a configuration can reduce the generation of current collapse to some extent if the requirement for the normally-off operation is canceled.

The structure disclosed in Japanese Unexamined Patent Application Publication No. 2013-115362 can readily attain the normally-off operation because the recess structure is disposed immediately under the gate. Unfortunately, the edge 52 of the gate electrode having the largest electric field intensity between the gate and the drain is in contact with the thin C-rich barrier layer 46. For this reason, electrons are trapped at an impurity level derived from the carbon contained in the C-rich barrier layer 46 in contact with the channel layer 43 near the edge 52 of the gate electrode, significantly generating current collapse. Moreover, the surface leak in (2) cannot be prevented since part of the C-poor barrier layer 44 between the gate and the drain is not covered with the C-rich barrier layer 46. Accordingly, the structure disclosed in Japanese Unexamined Patent Application Publication No. 2013-115362 cannot have compatibility between the a small amount of gate leakage current and the prevention in generation of current collapse at 600 V.

The present disclosure has been made in consideration of these problems. An object of the present disclosure is to provide a nitride semiconductor device enabling normally-off operation and having reduced gate leakage current while generation of current collapse is prevented, and a method of manufacturing the nitride semiconductor device.

SUMMARY

The semiconductor device according to one aspect of the present disclosure is a nitride semiconductor device, including: a substrate; a channel layer disposed on the substrate; a carbon-poor barrier layer disposed on the channel layer and having a recess; a carbon-rich barrier layer disposed over the recess and the carbon-poor barrier layer, and having a carbon content higher than a carbon content of the carbon-poor barrier layer; a gate electrode disposed on the recess; and a source electrode and a drain electrode disposed on opposing sides of the gate electrode and spaced from the gate electrode, wherein the carbon-poor barrier layer and the carbon-rich barrier layer contain carbon, the carbon-rich barrier layer has a carbon content higher than a carbon content of the carbon-poor barrier layer, the carbon-poor barrier layer and the carbon-rich barrier layer have bandgaps larger than a bandgap of the channel layer, an upper surface of the carbon-rich barrier layer includes a first main surface on which the source electrode and the drain electrode are disposed, a bottom surface of a depression disposed along the recess, and side surfaces of the depression connecting the first main surface to the bottom surface of depression, and among edges of the depression of the carbon-rich barrier layer which are boundaries between the first main surface and the side surfaces of the depression, an edge of the depression of the carbon-rich barrier layer closest to the drain electrode is covered with the gate electrode.

In the semiconductor device according to one aspect of the present disclosure, use of a recess structure can reduce the thickness of the barrier layer disposed immediately under the gate electrode, readily achieving the normally-off operation. The C-rich barrier layer interposed between the gate electrode and the 2DEG layer, the C-rich barrier layer interposed between the gate electrode and the C-poor barrier layer, and the surface of the barrier layer between the gate and the drain covered with the C-rich barrier layer can significantly reduce the gate leakage current. Moreover, the edge of the gate located out of the depression of the C-rich barrier layer can sufficiently increase the thickness of the barrier layer disposed immediately under the edge of the gate on which the electric field concentrates, preventing generation of the current collapse. Electrons trapped at the impurity level caused by carbon contained in the C-rich barrier layer covered with the gate are close to the gate, and are readily drawn to the gate under application of a positive voltage to the gate. As a result, generation of the current collapse can be prevented.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

The nitride semiconductor device according to one aspect of this disclosure will now be described with reference to the drawings. The present disclosure will not be limited to the following embodiment.

Figure 4:
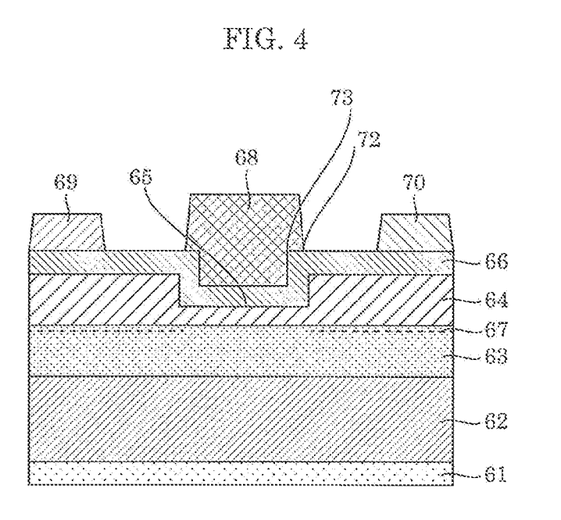
FIG. 4 is a sectional view illustrating a structure of a nitride semiconductor device according to an embodiment.

FIG. 4 is a sectional view illustrating a structure of a nitride semiconductor device according to an embodiment. More specifically, FIG. 4 illustrates a cross-sectional structure of a recessed FET including a C-rich barrier layer having a depression whose edge is located inside the edge of the gate electrode. The present embodiment is described using a Group III nitride semiconductor, but it should not be construed as limitation of the present disclosure.

The nitride semiconductor device according to the present embodiment includes a substrate 61 composed of Si having an appropriate (111) plane (or a substrate composed of sapphire, SiC, GaN, or AlN, for example), a buffer layer 62 (such as a single layer composed of a Group III nitride semiconductor GaN, AlGaN, AlN, InGaN, or AlInGaN or a multi-layer composed thereof), a channel layer 63 composed of GaN (or another Group III nitride semiconductor InGaN, AlGaN, or AlInGaN, for example), and a C-poor barrier layer 64 composed of AlGaN (or another Group III nitride semiconductor GaN, InGaN, AlGaN, or AlInGaN, for example), which are disposed in sequence.

The C-poor barrier layer 64 has a bandgap larger than that of the channel layer 63. For example, in the case where the C-poor barrier layer 64 is composed of AlGaN and the channel layer 63 is composed of GaN, a 2DEG layer 67 is generated in a high concentration in the GaN layer near the interface between AlGaN and GaN because of piezo charges and a difference in bandgap between AlGaN and GaN, which are generated from a difference in lattice constant between AlGaN and GaN.

The nitride semiconductor device according to the present embodiment includes a C-rich barrier layer 66 on the surface of the C-poor barrier layer 64. The C-rich barrier layer 66 has a recess 65. The C-rich barrier layer 66 is disposed over the entire surface of the C-poor barrier layer 64 including the inner walls of the recess 65, and is composed of AlGaN having a bandgap larger than that of the channel layer 63 (or composed of another Group III nitride semiconductor GaN, InGaN, or AlInGaN, for example). The C concentration of the C-rich barrier layer 66 is higher than that of the C-poor barrier layer 64. The C-rich barrier layer 66 is disposed along the recess 65, and as a result, has a depression on the surface of the C-rich barrier layer 66 and the edge 73 of the depression. In other words, the upper surface of the C-rich barrier layer 66 includes a first main surface on which a source electrode 69 and a drain electrode 70 are dispose, the bottom surface of the depression disposed along the recess 65, and side surfaces of the depression connecting the first main surface to the bottom surface of depression, wherein the edge 73 of the depression of the C-rich barrier layer is a boundary between the first main surface and the side surfaces of the depression.

The nitride semiconductor device according to the present embodiment includes a gate electrode 68 above the recess 65, and a source electrode 69 and a drain electrode 70 disposed on opposing sides of the gate electrode 68 and spaced from the gate electrode 68. The gate electrode 68 may be a metal electrode (such as an electrode composed of one metal such as Ti, Ni, Pd, Pt, or Au or two or more metals thereof in combination) in schottky contact with the C-rich barrier layer 66, or may be a p type GaNl layer (or another p type nitride semiconductor p-InGaN, p-AlGaN, or p-AlInGaN, for example).

In the case where the gate electrode 68 is a p type GaN layer, a metal electrode (not illustrated) in contact with in part of the p type GaN layer should be separately disposed. In this case, the metal electrode (electrode composed of one metal such as Ti, Ni, Pd, Pt, Ti, Al, Mo, Hf, or Zr or two or more metals thereof in combination) in contact with part of the p type GaN layer may be in ohmic contact or schottky contact with the p type GaN layer.

The source electrode 69 and the drain electrode 70 may be in ohmic contact with one of the channel layer 63, the C-poor barrier layer 64, and the C-rich barrier layer 66. For example, the source electrode 69 and the drain electrode 70 may be disposed on the surface of the C-rich barrier layer 66, or may be disposed in partial contact with the C-rich barrier layer 66, the C-poor barrier layer 64, the 2DEG layer 67, and the channel layer 63 using a known ohmic recess technique.

Edges 73 of the depression of the C-rich barrier layer are located inside the edge 72 of the gate electrode. At least the edge 73 of the depression of the C-rich barrier layer close to the drain is located inside the edge 72 of the gate electrode close to the drain. The edge 73 of the depression of the C-rich barrier layer does not always need to be located inside the edge 72 of the gate electrode close to the source. In other words, among the edges 73 of the depression of the C-rich barrier layer, the edge 73 closest to the drain electrode 70 is covered with the gate electrode 68. If the total thickness of the C-poor barrier layer 64 and the C-rich barrier layer 66 located immediately under the edge 72 of the gate electrode is extremely small to significantly reduce the distance from the channel to the surface of the semiconductor, electrons trapped at the surface level significantly generate current collapse. For this reason, the total thickness of the C-poor barrier layer 64 and the C-rich barrier layer 66 located immediately under the edge 72 of the gate electrode should be at least 20 nm or more, and should be 30 nm or more for application to the power semiconductor devices having a rating of 600 V or more.

In the case where the gate electrode 68 in this structure is a metal electrode in schottky contact with the C-rich barrier layer 66, the achievement of the normally-off operation requires adjustment of the Al composition and the total thickness of AlGaN in the C-poor barrier layer 64 composed of AlGaN and the C-rich barrier layer 66 composed of AlGaN disposed under and on the recess 65 immediately under the gate electrode 68, respectively. Specifically, for example, in the case where the AlGaN barrier layer of these layers contains 20% Al composition, the total thickness of the layers located immediately under the gate electrode 68 should be about 10 nm or less.

In the case where the gate electrode 68 in this structure is a semiconductor composed of a p type GaN layer, the achievement of the normally-off operation requires adjustment of the Al composition and the total thickness of AlGaN in the C-poor barrier layer 64 composed of AlGaN and the C-rich barrier layer 66 composed of AlGaN disposed under and on the recess immediately under the gate electrode 68, respectively. Specifically, for example, in the case where the AlGaN barrier layer of these layers contains 20% Al composition, the total thickness of the layers located immediately under the edge 72 of the gate electrode should be about 20 nm or less.

The method of manufacturing the nitride semiconductor device according to the present embodiment (not illustrated) will now be described. A minimum configuration of the manufacturing method will be described, but this configuration should not be construed as limitation on this disclosure. The order of steps in the manufacturing method should not be construed as limitation.

First, an appropriate buffer layer 62 (such as a single layer composed of a Group III nitride semiconductor GaN, AlGaN, AlN, InGaN, or AlInGaN or a multi-layer composed thereof) is formed on a substrate 61 composed of Si having an appropriate (111) plane (or a substrate composed of sapphire, SiC, GaN, or AlN, for example) by a known epitaxial growth technique, such as MOCVD). On the buffer layer 62, a channel layer 63 composed of GaN (or another Group III nitride semiconductor InGaN, AlGaN, or AlInGaN) is continuously formed. On the channel layer 63, a C-poor barrier layer 64 composed of AlGaN (or another Group III nitride semiconductor composed of GaN, InGaN, AlInGaN, for example) having a bandgap larger than that of the channel layer 63 is continuously formed.

In the next step, a recess 65 is formed in the C-poor barrier layer 64 by a known photolithography technique and a known dry etching technique. The recess 65 may have a bottom contained in the C-poor barrier layer 64, or the recess may penetrate through the C-poor barrier layer 64 to have a bottom contained in the channel layer 63 (see FIG. 5).

A C-rich barrier layer 66 composed of AlGaN (or another Group III nitride semiconductor GaN, InGaN, or AlInGaN, for example) having a bandgap larger than that of the channel layer 63 is then regrown by a known MOCVD technique so as to cover the entire surface of the C-poor barrier layer 64 including the inner surface of the recess 65. At this time, the C-rich barrier layer 66 can be regrown on such conditions that the recess 65 is not filled. Specifically, the longitudinal growth (three-dimensional growth) rate can be substantially identical to the traverse growth (two-dimensional growth) rate, or the longitudinal growth (three-dimensional growth) rate can be higher than the traverse growth (two-dimensional growth) rate. On such regrowth conditions, the C-rich barrier layer 66 is formed along the inner walls of the recess 65, resulting in a depression disposed on the surface of the C-rich barrier layer 66. The C-rich barrier layer 66 has a C concentration higher than that of the C-poor barrier layer 64 by varying the growth conditions of the C-rich barrier layer 66 such as the growth pressure, the V/III ratio, the growth temperature, and the growth rate 66 compared to those of the C-poor barrier layer 64.

For example, in the case where the gate electrode 68 is a metal electrode, before formation of a gate electrode 68, a source electrode 69 and a drain electrode 70 are formed spaced from a position in which the gate electrode 68 is to be disposed, using known techniques such as photolithography, deposition, sputtering technique, and dry etching, for example. In the case where the gate electrode 68 is a metal electrode, the gate electrode 68 is formed as a metal electrode (such as an electrode composed of one metal such as Ti, Ni, Pd, Pt, or Au or two or more metals thereof in combination) in schottky contact with the C-rich barrier layer 66 using known techniques such as photolithography, deposition, sputtering technique, and dry etching.

For example, in the case where the gate electrode 68 is a p type nitride semiconductor layer, the growth of the C-rich barrier layer 66 is continuously followed by regrowth of a p type nitride semiconductor by MOCVD. The p type nitride semiconductor can be regrown such conditions that the depression on the surface of the C-rich barrier layer 66 is completely filled. Specifically, the traverse growth (two-dimensional growth) rate can be higher than the longitudinal growth (three-dimensional growth) rate. The p type nitride semiconductor is then selectively etched by a known photolithography technique and a known selective dry etching technique to form a gate electrode 68. The source electrode 69 and the drain electrode 70 are then formed spaced from the gate electrode 68 using known techniques such as photolithography, deposition, sputtering technique, and dry etching. In the case where the gate electrode 68 is a p type semiconductor, a metal electrode (not illustrated) in partial contact with the p type semiconductor should be separately disposed. In this case, the metal electrode (electrode composed of one metal such as Ti, Ni, Pd, Pt, Ti, Al, Mo, Hf, or Zr or two or more metals in combination) in partial contact with the p type semiconductor may be in ohmic contact or schottky contact with the p type semiconductor. The metal electrode in partial contact with the p type semiconductor is formed by a known photolithography technique, deposition technique, sputtering technique, and dry etching technique.

The normally-off operation of the FET in the nitride semiconductor device according to the present embodiment will now be described. In the normally-off operation, the nitride semiconductor device according to the present embodiment is off at a voltage of a gate electrode 68 of 0 V because the 2DEG layer 67 is not present due to the depletion layer expanded immediately under the recess. The source electrode 69 is earthed, a positive drain voltage is applied to the drain electrode 70, and a positive gate voltage is applied to the gate electrode 68. When the gate voltage exceeds the threshold voltage, then the drain current starts flowing to turn the semiconductor device on. In a typical general-purpose power semiconductor device having a rating of 600 V, a maximum drain voltage of 600 V is applied to the semiconductor device which is in an off state. Such a power semiconductor device is instantaneously turned on in the shortest time of several nanoseconds. The power semiconductor device in the on state is instantaneously turned off in the shortest time of several nanoseconds into the off state in which a maximum drain voltage of 600 V is applied.

The nitride semiconductor device according to the present embodiment having a recess structure can reduce the thickness of the barrier layer disposed immediately under the gate electrode to facilitate the normally-off operation. The C-rich barrier layer is interposed between the gate electrode and the 2DEG layer. The side walls of the recess have the C-rich barrier layer interposed between the gate electrode and the C-poor barrier layer. The surface of the C-poor barrier layer between the gate electrode and the drain electrode is covered with the C-rich barrier layer. In such a configuration, the gate leakage path can be completely surrounded by the C-rich barrier layer, significantly reducing the gate leakage current. Moreover, the edge of the gate located out of the depression of the C-rich barrier layer can sufficiently increase the barrier layer disposed immediately under the edge of the gate on which the electric field concentrates. As a result, this increased thickness of the barrier layer can prevent generation of the current collapse. Electrons trapped at the impurity level caused by carbon contained in the C-rich barrier layer covered with the gate electrode are close to the gate electrode, and are readily drawn to the gate under application of the positive voltage to the gate. As a result, generation of current collapse can be prevented. In the case where the gate electrode is a p type semiconductor layer, electrons trapped at the impurity level caused by carbon contained in the C-rich barrier layer covered with the gate electrode can be canceled by holes injected from the p type layer under application of the positive voltage to the gate, preventing generation of the current collapse.

Figure 5:
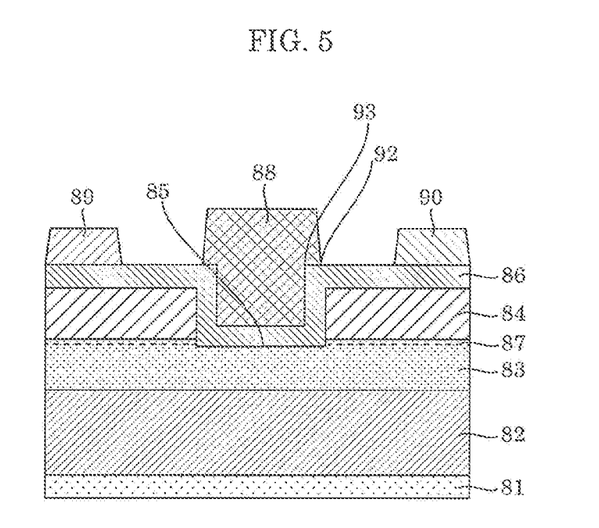
FIG. 5 is a sectional view illustrating a structure of a nitride semiconductor device according to Modification 1 of the embodiment.

FIG. 5 is a sectional view illustrating a structure of a nitride semiconductor device according to Modification 1 of the embodiment. More specifically, FIG. 5 illustrates a cross-sectional structure of a penetrating recessed FET having the C-rich barrier layer 86 in which the edge of a depression 93 in the C-rich barrier layer is located inside the edge 92 of a gate electrode. Unlike the nitride semiconductor device according to the embodiment, a recess 85 penetrates through the C-poor barrier layer 84 to reach an inside of a channel layer 83. For this reason, only a C-rich barrier layer 86 is in contact with the inner walls of the recess 85.

In the nitride semiconductor device according to this modification, in the case where the gate electrode 88 is a metal electrode in schottky contact with the C-rich barrier layer 86, the achievement of the normally-off operation requires adjustment of the Al composition and the thickness of AlGaN in the C-rich barrier layer 86 composed of AlGaN and disposed immediately under the gate electrode 88 and on the recess. Specifically, for example, in the case where the C-rich barrier layer 86 composed of AlGaN contains 20% Al composition, the thickness of the C-rich barrier layer 86 immediately under the gate electrode 88 should be about 10 nm or less.

In the nitride semiconductor device according to this modification, in the case where the gate electrode 88 is a semiconductor including a p type GaN layer, the achievement of the normally-off operation requires adjustment of the Al composition and the thickness of AlGaN in the C-rich barrier layer 86 composed of AlGaN and disposed immediately under the gate electrode 88 and on the recess. Specifically, for example, in the case where the AlGaN barrier layer contains 20% Al composition, the thickness of the C-rich barrier layer 86 immediately under the gate electrode 88 should be about 20 nm or less.

The configuration of the nitride semiconductor device according to this modification provides additional effects besides the effects attained by the nitride semiconductor device according to the embodiment illustrated in FIG. 4: Since the threshold voltage is controlled to be applied only to the C-rich barrier layer 86 disposed on the recess and does not have a fluctuation in the etched surface of the recess, in-plane uniformity and controllability are enhanced. Since the C-rich barrier layer 86 is disposed immediately on the recess 85, the C-rich barrier layer 86 is in contact with a 2DEG layer 87. This configuration might generate the current collapse caused by electrons trapped at the impurity level caused by carbon contained in the C-rich barrier layer 86. However, as in the effects of the nitride semiconductor device according to the embodiment illustrated in FIG. 4, electrons trapped at the impurity level caused by carbon contained in the C-rich barrier layer 86 are close to the gate, and are readily drawn to the gate under application of a positive voltage to the gate. As a result, generation of the current collapse can be prevented. In the case where the gate electrode 88 is a p type layer, electrons trapped at the impurity level caused by carbon contained in the C-rich barrier layer 86 covered with the gate electrode 88 can be canceled by holes injected from the p type layer under application of a positive voltage to the gate. As a result, generation of the current collapse can be prevented.

Figure 6:
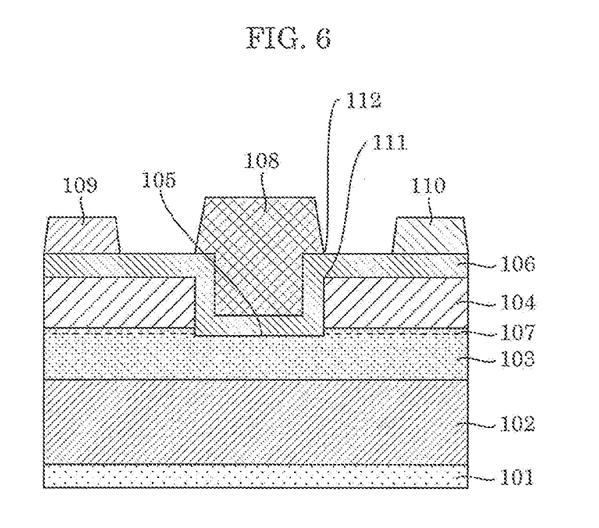
FIG. 6 is a sectional view illustrating a structure of a nitride semiconductor device according to Modification 2 of the embodiment.

FIG. 6 is a sectional view illustrating a structure of a nitride semiconductor device according to Modification 2 of the embodiment. More specifically, FIG. 6 illustrates a cross-sectional structure of a recessed FET including a C-rich barrier layer 106 in which an edge 112 of a gate electrode is disposed immediately above an edge 111 of a recess. Unlike the nitride semiconductor devices according to the embodiment and Modification 1, the edge 111 of the recess is disposed immediately under the edge 112 of the gate electrode. In other words, the upper surface of the C-poor barrier layer 104 includes a second main surface facing the first main surface, and side surfaces of the recess. In the cross-sectional view of the gate electrode 108 and the C-rich barrier layer 106, among the edges of the recess which are boundaries between the second main surface and the side surfaces of the recess, the edge 111 of the recess closest to the drain electrode 110 is disposed immediately under the edge 112 of the gate electrode.

The configuration of the nitride semiconductor device according to this modification provides additional effects besides the effects attained by the nitride semiconductor devices illustrated in FIG. 4 and FIG. 5: a single C-rich barrier layer 106 and a laminate of the C-poor barrier layer 104 and the C-rich barrier layer 106 are both disposed immediately under the edge 112 of the gate electrode on which the electric field concentrates most when the nitride semiconductor device is off. Unlike the case where the gate electrode has only the C-rich barrier layer 106 immediately under the edge thereof, a half of the C-rich barrier layer 106 is spaced from the 2DEG layer 107, preventing generation of the current collapse.

Figure 7:
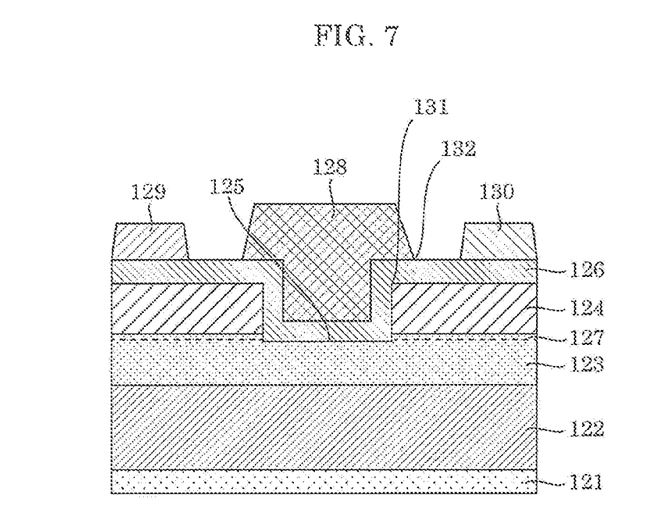
FIG. 7 is a sectional view illustrating a structure of a nitride semiconductor device according to Modification 3 of the embodiment.

FIG. 7 is a sectional view illustrating a structure of a nitride semiconductor device according to Modification 3 of the embodiment. More specifically, FIG. 7 illustrates a cross-sectional structure of a recessed FET having a C-rich barrier layer 126 in which an edge 131 of a recess is located inside an edge 132 of a gate electrode. Unlike the nitride semiconductor devices according to the embodiment and Modification 1, the edge 131 of the recess is located inside the edge 132 of the gate electrode. In other words, in the cross-sectional view of the gate electrode 128 and the C-rich barrier layer 126, among the edges of the recess, the edge 131 of the recess closest to the drain electrode 130 is located at a position opposite to the drain electrode 130 with respect to a position immediately under the edge 132 of the gate electrode.

The configuration of the nitride semiconductor device according to this modification provides additional effects besides the effects attained by the nitride semiconductor devices illustrated in FIGS. 4, 5, and 6: only a laminate of the C-poor barrier layer 124 and the C-rich barrier layer 126 is disposed immediately under the edge 132 of the gate electrode on which the electric field concentrates most when the nitride semiconductor device is off. In such a configuration, the C-rich barrier layer 126 is disposed away from the 2DEG layer 127, therefore preventing generation of the current collapse.

Figure 8:
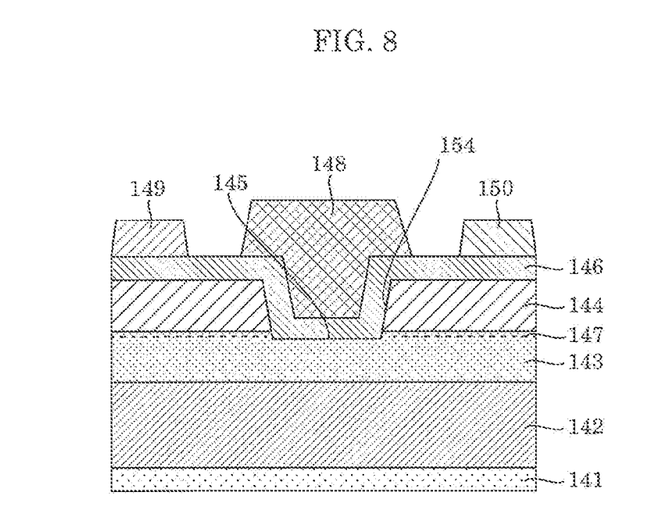
FIG. 8 is a sectional view illustrating a structure of a nitride semiconductor device according to Modification 4 of the embodiment.

FIG. 8 is a sectional view illustrating a structure of a nitride semiconductor device according to Modification 4 of the embodiment. More specifically, FIG. 8 illustrates a cross-sectional structure of a tapered-recessed FET including a C-rich barrier layer 146 in which the edge of a depression of a C-rich barrier layer is located inside the edge of a gate electrode. Unlike the nitride semiconductor device according to Modification 3 illustrated in FIG. 7, the edge of the recess is tapered.

The nitride semiconductor device according to this modification includes the recess having tapered side walls 154 (the side walls of the recess have an inclination of 90° or less to a 2DEG layer 147 from a gate electrode 148 toward the outside) (drawings of tapered side walls of the recesses in FIGS. 4, 5, and 6 are not illustrated). In other words, the recess has a recess opening having a length longer than that of the bottom of the recess in an aligning direction of a source electrode 149 and a drain electrode 150.

The configuration of the nitride semiconductor device according to this modification provides additional effects besides the effects attained by the nitride semiconductor devices illustrated in FIGS. 4 to 7: The tapered side walls 154 of the recess can relax the concentration of the electric field to the edge of the recess on which the electric field concentrates next to the edge of the gate. Such a configuration can prevent trapping of electrons at the impurity level caused by carbon contained in the C-rich barrier layer 146, preventing generation of the current collapse.

Figure 9:
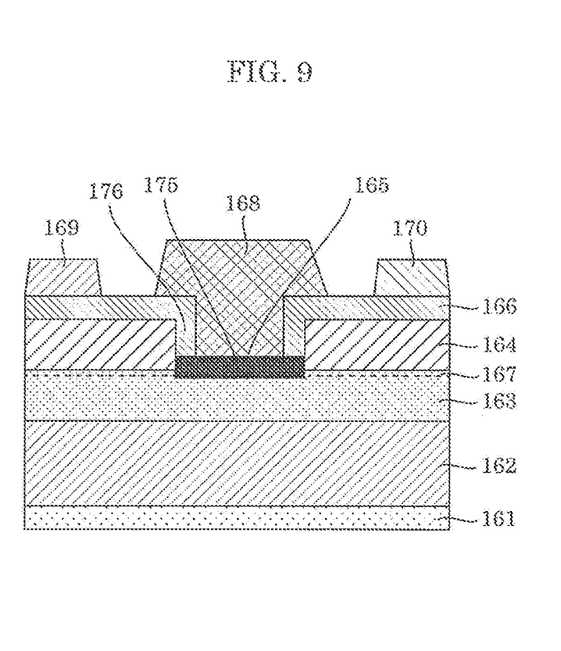
FIG. 9 is a sectional view illustrating a structure of a nitride semiconductor device according to Modification 5 of the embodiment.

FIG. 9 is a sectional view illustrating a structure of a nitride semiconductor device according to Modification 5 of the embodiment. More specifically, FIG. 9 illustrates a cross-sectional structure of a recessed FET including a C-rich barrier layer 166 in which the edge of a depression of a C-rich barrier layer 166 is located inside the edge of a gate electrode, and the C-rich barrier layer 166 has a higher carbon concentration in the bottom 175 of a recess (region including the bottom surface of a depression) than that in side walls 176 of the recess (region including side surfaces of the depression). Unlike the nitride semiconductor device according to Modification 3, the carbon concentration of C-rich barrier layer 166 on the bottom 175 of the recess is higher than that on the side walls 176 of the recess (drawings corresponding to FIGS. 4, 5, 6, and 8 are not illustrated).

The configuration of the nitride semiconductor device according to this modification provides additional effects besides the effects attained by the nitride semiconductor devices illustrated in FIGS. 4 to 8: only the 2DEG leakage from a gate electrode 168 to the 2DEG layer 167 in the route of gate leakage current can be effectively prevented. The 2DEG leakage is a leak component occupying a higher proportion than those of surface leakage and barrier leakage in of the gate leak components. In this structure, the gate leakage current can be effectively prevented through addition of a minimum amount of carbon. The addition of a minimum amount of carbon can relatively reduce the C concentration of the edge of the gate electrode on which the electric field concentrates most when the nitride semiconductor device is off, reducing the impurity level itself caused near the edge of the gate electrode by carbon contained in the C-rich barrier layer 166, and thus preventing generation of the current collapse.

Figure 10:
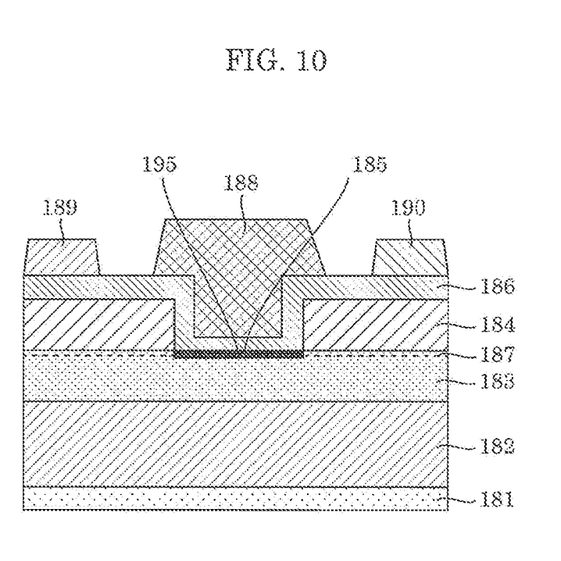
FIG. 10 is a sectional view illustrating a structure of a nitride semiconductor device according to Modification 6 of the embodiment.

FIG. 10 is a sectional view illustrating a structure of a nitride semiconductor device according to Modification 6 of the embodiment. More specifically, FIG. 10 illustrates a cross-sectional structure of a penetrating recessed FET including a C-rich barrier layer 186 in which the edge of a depression of a C-rich barrier layer 186 is located inside the edge of a gate electrode, and a C-rich barrier layer 186 on a bottom 195 of a recess partially has a higher C concentration than that on side walls of the recess. Unlike the nitride semiconductor device according to Modification 5, the carbon concentration of a channel portion is higher than that of a barrier portion (not illustrated) where the barrier portion is defined as a portion including both of a C-poor barrier layer 184 and the C-rich barrier layer 186 disposed above a first extending surface of the boundary between the C-poor barrier layer 184 and the channel layer 183 in a non-recess region, and the channel portion is defined as the channel layer 183 below the first extending surface (drawings corresponding to FIGS. 4, 5, 6, and 8 are not illustrated).

The configuration of the nitride semiconductor device according to this modification provides additional effects besides the effects attained by the nitride semiconductor devices illustrated in FIGS. 4 to 9: of the 2DEG leakage from a gate electrode 188 to a 2DEG layer 187 in the route of gate leakage current, only the 2DEG leakage in a portion in pinpoint contact with the 2DEG layer 187 can be effectively prevented. In this structure, the gate leakage current can be effectively prevented through addition of a minimum amount of carbon. The addition of a minimum amount of carbon can relatively reduce the C concentration of the edge of the gate on which the electric field concentrates most when the nitride semiconductor device is off. As a result, a minimum amount of carbon can reduce the impurity level itself caused near the edge of the gate by carbon contained in the C-rich barrier layer 186, and thus preventing generation of the current collapse.

Figure 11:
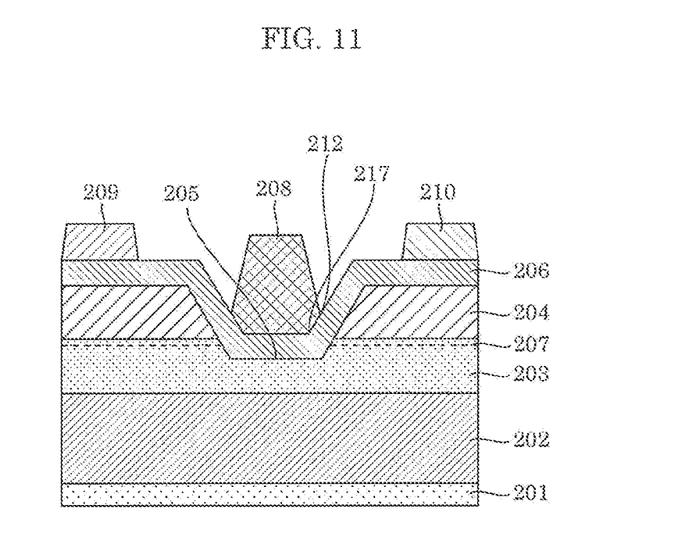
FIG. 11 is a sectional view illustrating a structure of a nitride semiconductor device according to Modification 7 of the embodiment.

FIG. 11 is a sectional view illustrating a structure of a nitride semiconductor device according to Modification 7 of the embodiment. More specifically, FIG. 11 illustrates a cross-sectional structure of a tapered-recessed FET including a C-rich barrier layer 206 in which the bottom edge of a depression of a C-rich barrier layer 206 is located inside an edge 212 of a gate electrode.

In the nitride semiconductor device according to this modification, the C-rich barrier layer 206 formed so as to cover a recess 205 has a depression having an opening in an aligning direction of a source electrode 229 and a drain electrode 230. The length of the opening is longer than that of the bottom of the depression in the aligning direction (in other words, the depression has tapered side walls), and an edge 217 of the C-rich barrier layer 206 close to the bottom of the depression (bottom surface of the edge of the depression) is located inside an edge 212 of the gate electrode (drawing corresponding to FIG. 4 is not illustrated). In other words, the upper surface of the C-rich barrier layer 206 includes a first main surface on which a source electrode 209 and a drain electrode 210 are disposed, the bottom surface of the depression formed along the recess 205, and side surfaces of the depression connecting the first main surface to the bottom surface of the depression. Of the edges of the bottom surface of the depression which are boundaries between the bottom surface of the depression and the side surfaces of the depression, the edge of the bottom surface of the depression closest to the drain electrode 210 is covered with the gate electrode 208.

The configuration of the nitride semiconductor device according to this modification can reduce the thickness of the barrier layer disposed immediately under the gate electrode 208 because of its recess structure, facilitating the normally-off operation. The C-rich barrier layer 206 is interposed between the gate electrode 208 and the 2DEG layer 207. In the side walls of the recess, the C-rich barrier layer 206 is interposed between the gate electrode 208 and the C-poor barrier layer 204. The surface of the C-poor barrier layer between the gate electrode and the drain electrode is covered with the C-rich barrier layer 206. In such a configuration, the gate leakage path can be completely surrounded by the C-rich barrier layer 206, significantly reducing the gate leakage current. Such a configuration can provide a sufficient thickness of the barrier layer disposed immediately under the edge 212 of the gate electrode to which the electric field concentrates, preventing generation of the current collapse. Electrons trapped at the impurity level caused by carbon contained in the C-rich barrier layer 206 covered with the gate electrode 208 are close to the gate electrode 208, and are readily drawn to the gate electrode 208 under application of a positive voltage to the gate. As a result, generation of current collapse can be prevented. In the case where the gate electrode 208 is a p type layer, electrons trapped at the impurity level caused by carbon contained in the C-rich barrier layer 206 covered with the gate electrode 208 can be canceled by holes injected from the p type layer under application of a positive voltage to the gate, preventing generation of the current collapse. Furthermore, the tapered side walls of the C-rich barrier layer 206 can relax the concentration of the electric field to the edge of the bottom of the depression of the C-rich barrier layer 206 on which the electric field concentrates next to the edge of the gate. As a result, trapping of electrons at the impurity level caused by carbon contained in the C-rich barrier layer 206 can be prevented, preventing generation of the current collapse.

Figure 12:
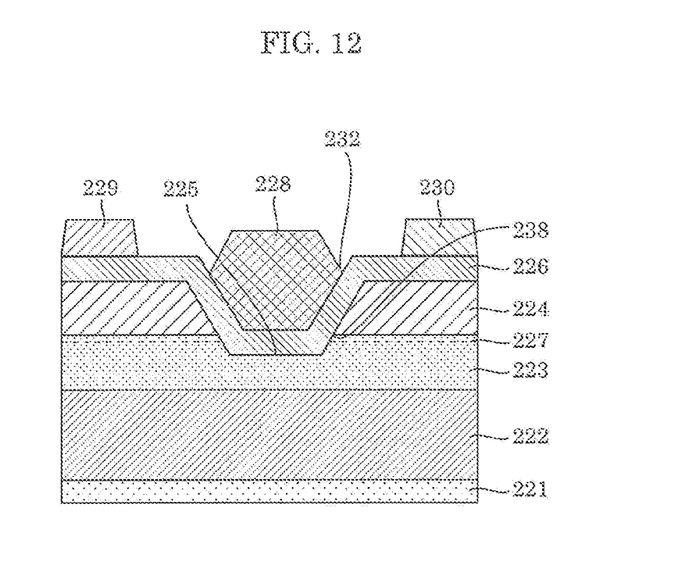
FIG. 12 is a sectional view illustrating a structure of a nitride semiconductor device according to Modification 8 of the embodiment.

FIG. 12 is a sectional view illustrating a structure of a nitride semiconductor device according to Modification 8 of the embodiment. More specifically, FIG. 12 illustrates a cross-sectional structure of a tapered-recessed FET including a C-rich barrier layer 226 in which an edge 238 of the C-poor barrier layer close to the drain is located inside an edge 232 of a gate electrode. Unlike the nitride semiconductor device according to Modification 5, the edge 238 of the C-poor barrier layer 224 close to the drain (edge of the bottom surface of the recess) is located inside the edge 232 of the gate electrode in the nitride semiconductor device according to this modification. In other words, the upper surface of the C-poor barrier layer 224 includes a second main surface facing the first main surface, and side surfaces of the recess connecting the second main surface to the bottom surface of the recess 225. In the cross-sectional view of the gate electrode 228 and the C-poor barrier layer 224, among the edges of the bottom surface of the recess which are boundaries between the side surfaces of the recess and the bottom surface of the recess, the edge of the bottom surface of the recess closest to the drain electrode 230 is located at a position opposite to the drain electrode 230 with respect to a position immediately under the edge of the gate electrode 228 close to the drain.

The configuration of the nitride semiconductor device according to this modification provides additional effects besides the effects attained by the nitride semiconductor device illustrated in FIG. 11: only a laminate of the C-poor barrier layer 224 and the C-rich barrier layer 226 is disposed immediately under the edge 232 of the gate electrode on which the electric field concentrates most when the nitride semiconductor device is off. In such a configuration, the C-rich barrier layer 226 is disposed away from the 2DEG layer 227, therefore preventing generation of the current collapse.

Figure 13:
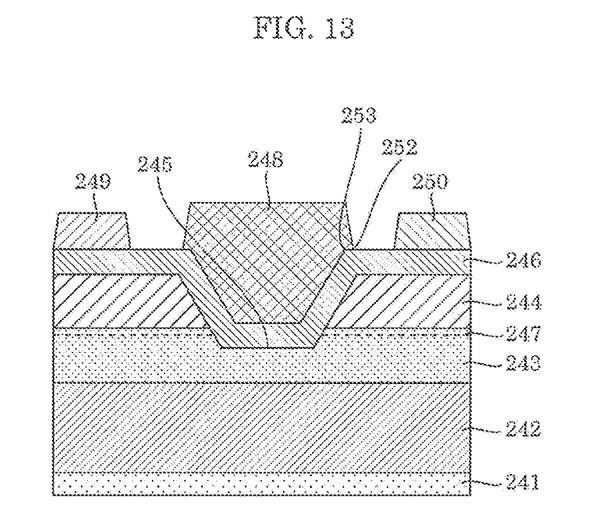
FIG. 13 is a sectional view illustrating a structure of a nitride semiconductor device according to Modification 9 of the embodiment.

FIG. 13 is a sectional view illustrating a structure of a nitride semiconductor device according to Modification 9 of the embodiment. More specifically, FIG. 13 illustrates a cross-sectional structure of a tapered-recessed FET including a C-rich barrier layer 246 in which an edge 253 of a depression of a C-rich barrier layer is located inside an edge 252 of a gate electrode. Unlike the nitride semiconductor devices according to Modifications 7 and 8, the edge of the depression of the C-rich barrier layer 246 close to the drain (edge 253 of the depression of the C-rich barrier layer) is located inside the edge 252 of the gate electrode (drawing corresponding to FIG. 4 is not illustrated). In other words, among the edges of the depression of the C-rich barrier layer which are boundaries between the first main surface and the side surfaces of the depression, the edge 253 of the depression of the C-rich barrier layer closest to the drain electrode 250 is covered with a gate electrode 248.

The configuration of the nitride semiconductor device according to this modification provides additional effects besides the effects attained by the nitride semiconductor devices illustrated in FIGS. 11 and 12: Only a laminate of a C-poor barrier layer 244 and the C-rich barrier layer 246 is disposed immediately under and near the edge 252 of the gate electrode on which the electric field concentrates most when the nitride semiconductor device is off. The C-poor barrier layer 244 and the C-rich barrier layer 246 have a sufficient total thickness. In such a configuration, the C-rich barrier layer 246 is disposed sufficiently away from the 2DEG layer 247, more significantly preventing generation of the current collapse.

Figure 14:
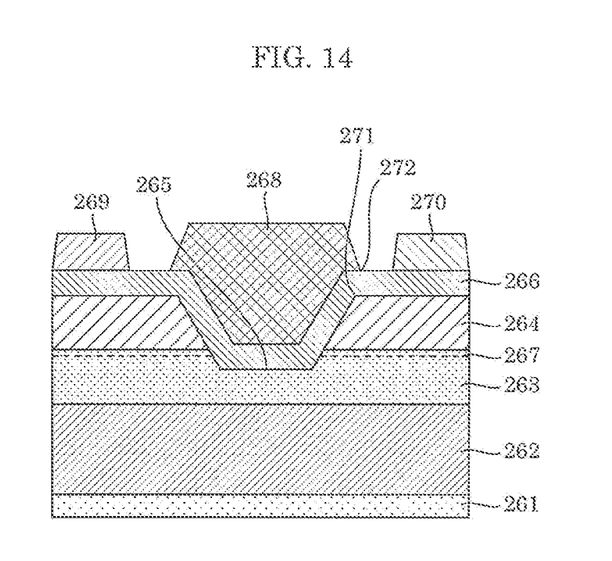
FIG. 14 is a sectional view illustrating a structure of a nitride semiconductor device according to Modification 10 of the embodiment.

FIG. 14 is a sectional view illustrating a structure of a nitride semiconductor device according to Modification 10 of the embodiment. More specifically, FIG. 14 illustrates a cross-sectional structure of a tapered-recessed FET including a C-rich barrier layer 266 in which an edge of 271 of a recess is located inside an edge 272 of a gate electrode. Unlike the nitride semiconductor devices according to Modifications 7 to 9, the edge of the recess 265 close to the drain (edge 271 of the recess) is located inside the edge 272 of the gate electrode (drawing corresponding to FIG. 4 is not illustrated). In other words, the upper surface of the C-poor barrier layer 264 includes a second main surface facing the first main surface, and side surfaces of the recess. In the cross-sectional view of a gate electrode 268 and the C-rich barrier layer 266, among the edges of the recess which are boundaries between the second main surface and the side surfaces of the recess, the edge 271 of the recess closest to the drain electrode 270 is located at a position opposite to the drain electrode 270 with respect to a position immediately under the edge of the gate electrode 268 close to the drain.

The configuration of the nitride semiconductor device according to this modification provides additional effects besides the effects attained by the nitride semiconductor devices illustrated in FIGS. 11 to 13: Only a laminate of a C-poor barrier layer 264 and the C-rich barrier layer 266 is disposed immediately under or near the edge 272 of the gate electrode on which the electric field concentrates most when the nitride semiconductor device is off. The C-poor barrier layer 264 and the C-rich barrier layer 266 have a sufficient total thickness. The C-poor barrier layer is disposed in the highest proportion of the thickness of the C-poor barrier layer 264 to the thickness of the C-rich barrier layer 266. In such a configuration, the C-rich barrier layer 266 is disposed most significantly away from the 2DEG layer 267, most preventing generation of the current collapse.

Electrical properties were compared between the penetrating recessed FET including the C-rich barrier layer 126 according to the present embodiment illustrated in FIG. 7 (structure in which the edge of the recess is located inside the edge of the gate electrode) and a penetrating recessed FET according to Comparative Example, and the results are shown in Table 1.

TABLE 1

| Barrier layers | Gate leakage current (times) | Current collapse voltage (times) |
| --- | --- | --- |
| C-poor/C-poor (Comparative Example) | 1 | 1 |
| C-rich/C-poor (Example) | 0.03 | 1 |

The channel layer used herein was composed of GaN, and the C-poor barrier layer and the C-rich barrier layer used therein were both composed of $Al_{0.2}Ga_{0.8}N$. The C-poor barrier layer has a thickness of 30 nm to 80 nm. The gate electrode herein had a thickness of 100 nm to 500 nm, and was composed of an Mg-doped p type GaN (where the Mg concentration was 5 to $10 \times 10^{19}$ $cm^{-3}$). The gate leakage current and the amount of current collapse (voltage) were compared between the structure (structure in which the carbon concentration of the C-poor barrier layer 124 was $5 \times 10^{16}$ $cm^{-3}$, and the carbon concentration of the C-rich barrier layer 126 was $1 \times 10^{17}$ $cm^{-3}$) described in Example (Modification 3) and the structure according to Comparative Example (where the C concentration of the C-rich barrier layer was the same as that of the C-poor barrier layer ($5 \times 10^{16}$ $cm^{-3}$)). As a result, the gate leakage current of Example was reduced to about one third of that in Comparative Example without any change in the amount of current collapse (voltage) where the C concentration of the C-rich barrier layer was double the C concentration of the C-poor barrier layer.

In conclusion, use of the nitride semiconductor device according to the present embodiment reduced the gate leakage current, and prevented generation of the current collapse. The comparison of the gate leakage current between the FETs in Examples and Comparative Examples was performed using the median of about 1000 FETs in a wafer. In the comparison of the current collapse voltage, a single FET in the center of a wafer was repeatedly turned on and off at a predetermined drain voltage, and the comparison was performed using a drain voltage when the on resistance of the FET in the on state exceeded a predetermined value.

The C concentration shown in the present embodiment is determined according to the C content (carbon atoms/$cm^{-3}$) in crystals obtained by secondary ion mass spectrometry (SIMS), for example. In the calibration of the C concentration by SIMS, for example, a quantitative sample of GaN crystals containing carbon is calibrated, and SIMS analysis is performed on all of the layers (such as the channel layer, the C-poor barrier layer, and the C-rich barrier layer). For this reason, in a barrier layer composed of AlGaN, for example, the results of the calibration of the quantitative sample of GaN crystals is affected by a matrix effect known in SIMS, and does not always provide a true concentration of carbon in AlGaN. However, it is determined that the comparison of the C concentration shown in the present embodiment includes external influences such as this known matrix effect.

The C concentration in the single C-rich barrier layer may vary in the depth direction. Accordingly, the C concentration shown in the comparison of in the present embodiment is defined as the average concentration of carbon per depth of a single layer. The method of determining the C concentration described herein is only illustrative, and any known method for element analysis such as Auger electron (AES), energy dispersive X-ray analysis (EDS, EDX), or X-ray photoelectron spectroscopy (XPS) may be used in the analysis.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can provide an FET which can prevent the gate leakage current, and can reduce the current collapse, and thus can enhance the performance of power devices.

What is claimed is:

1. A nitride semiconductor device, comprising:
   a substrate;
   a channel layer disposed on the substrate;
   a carbon-poor barrier layer disposed on the channel layer and having a recess;
   a carbon-rich barrier layer disposed over the recess and the carbon-poor barrier layer, and having a carbon content higher than a carbon content of the carbon-poor barrier layer;
   a gate electrode disposed on the recess; and
   a source electrode and a drain electrode disposed on opposing sides of the gate electrode and spaced from the gate electrode,
   wherein the carbon-poor barrier layer and the carbon-rich barrier layer contain carbon,
   the carbon-rich barrier layer has a carbon content higher than a carbon content of the carbon-poor barrier layer,
   the carbon-poor barrier layer and the carbon-rich barrier layer have bandgaps larger than a bandgap of the channel layer,
   an upper surface of the carbon-rich barrier layer includes a first main surface on which the source electrode and the drain electrode are disposed, a bottom surface of a depression disposed along the recess, and side surfaces of the depression connecting the first main surface to the bottom surface of depression, and among edges of the depression of the carbon-rich barrier layer which are boundaries between the first main surface and the side surfaces of the depression, an edge of the depression of the carbon-rich barrier layer closest to the drain electrode is covered with the gate electrode.

2. The nitride semiconductor device according to claim 1, wherein the upper surface of the carbon-poor barrier layer includes a second main surface facing the first main surface, and side surfaces of the recess, and in a cross-sectional view of the gate electrode and the carbon-rich barrier layer, among edges of the recess which are boundaries between the second main surface and the side surfaces of the recess, an edge of the drain electrode closest to the recess is located immediately under an edge of the gate electrode close to the drain.

3. The nitride semiconductor device according to claim 1, wherein the upper surface of the carbon-poor barrier layer includes a second main surface facing the first main surface, and side surfaces of the recess, and in a cross-sectional view of the gate electrode and the carbon-rich barrier layer, among the edges of the recess which are boundaries between the second main surface and the side surfaces of the recess, the edge of the recess closest to the drain electrode is located in a position opposite to the drain electrode with respect to a position immediately under the edge of the gate electrode close to the drain.

4. The nitride semiconductor device according to claim 1, wherein the recess has a recess opening having a length longer than a length of a recess bottom in an aligning direction of the source electrode and the drain electrode.

5. The nitride semiconductor device according to claim 1, wherein in the carbon-rich barrier layer, a carbon concentration of a region including the bottom surface of the depression is higher than a carbon concentration of a region including the side surfaces of the depression.

6. The nitride semiconductor device according to claim 1, wherein the recess has a penetrating recess structure in which the recess penetrates from an upper surface through a bottom surface of the carbon-poor barrier layer, the carbon-rich barrier layer includes a barrier portion disposed above a first extending surface extending from an interface between the carbon-poor barrier layer and the channel layer in a non-recess portion, and a channel portion disposed below the first extending surface, and a carbon concentration of the channel portion is higher than a carbon concentration of the barrier portion.

7. A nitride semiconductor device, comprising:
a substrate;
a channel layer disposed on the substrate;
a carbon-poor barrier layer disposed on the channel layer and having a recess;
a carbon-rich barrier layer disposed over the recess and the carbon-poor barrier layer, and having a carbon content higher than a carbon content of the carbon-poor barrier layer;
a gate electrode disposed on the recess; and a source electrode and a drain electrode disposed spaced from the gate electrode with the gate electrode being interposed between the source electrode and the drain electrode, wherein the carbon-rich barrier layer has a depression having an opening having a length longer than a length of a bottom of the depression in an aligning direction of the source electrode and the drain electrode, the carbon-poor barrier layer and the carbon-rich barrier layer both contain carbon, the carbon-rich barrier layer has a carbon content higher than a carbon content of the carbon-poor barrier layer, the carbon-poor barrier layer and the carbon-rich barrier layer have bandgaps larger than a bandgap of the channel layer, an upper surface of the carbon-rich barrier layer includes a first main surface on which the source electrode and the drain electrode are disposed, a bottom surface of the depression disposed along the recess, and side surfaces of the depression connecting the first main surface to the bottom surface of depression, and among edges of the bottom surface of the depression which are boundaries between the bottom surface of the depression and the side surfaces of the depression, an edge of the bottom surface of the depression closest to the drain electrode is covered with the gate electrode.

8. The nitride semiconductor device according to claim 7, wherein the recess has a penetrating recess structure in which the recess penetrates from an upper surface to a bottom surface of the carbon-poor barrier layer, the upper surface of the carbon-poor barrier layer includes a second main surface facing the first main surface, and side surfaces of the recess connecting the second main surface to the bottom surface of the recess, and in a cross-sectional view of the gate electrode and the carbon-poor barrier layer, among edges of the bottom surface of the recess which are boundaries between the side surfaces of the recess and the bottom surface of the recess, an edge of the bottom surface of the recess closest to the drain electrode is located in a position opposite to the drain electrode with respect to a position immediately under an edge of the gate electrode close to the drain.

9. The nitride semiconductor device according to claim 7, wherein among edges of the depression of the carbon-rich barrier layer which are boundaries between the first main surface and the side surfaces of the depression, an edge of the depression of the carbon-rich barrier layer closest to the drain electrode is covered with the gate electrode.

10. The nitride semiconductor device according to claim 7, wherein an upper surface of the carbon-poor barrier layer includes a second main surface facing the first main surface, and side surfaces of the recess, in a cross-sectional view of the gate electrode and the carbon-rich barrier layer, among edges of the recess which are boundaries between the second main surface and the side surfaces of the recess, an edge of the recess closest to the drain electrode is located at a position opposite to the drain electrode with respect to a position immediately under an edge of the gate electrode close to the drain.

11. The nitride semiconductor device according to claim 1, in a cross-sectional view of the gate electrode, the carbon-poor barrier layer, and the carbon-rich barrier layer, a total thickness of the carbon-poor barrier layer and the carbon-rich barrier layer located immediately under the edge of the gate electrode close to the drain is 30 nm or more.

12. A method of manufacturing a nitride semiconductor device, comprising:
- forming a channel layer on a substrate;
- forming a carbon-poor barrier layer on the channel layer, the carbon-poor barrier layer containing carbon and having a bandgap larger than a bandgap of the channel layer;
- forming a recess in the carbon-poor barrier layer;
- forming a carbon-rich barrier layer over the recess and the carbon-poor barrier layer, the carbon-rich barrier layer having a bandgap larger than a bandgap of the channel layer and having a carbon content higher than a carbon content of the carbon-poor barrier layer;
- forming a gate electrode above the recess and on the carbon-rich barrier layer; and
- forming a source electrode and a drain electrode on the carbon-rich barrier layer on opposing sides of the gate electrode so as to be spaced from the gate electrode,
wherein an upper surface of the carbon-rich barrier layer includes a first main surface on which the source electrode and the drain electrode are disposed, a bottom surface of a depression disposed along the recess, and side surfaces of the depression connecting the first main surface to the bottom surface of the depression, and
in the forming a recess, the forming a carbon-rich barrier layer, and the forming a gate electrode, the recess, the carbon-rich barrier layer, and the gate electrode are formed such that among edges of the depression of the carbon-rich barrier layer which are boundaries between the first main surface and the side surfaces of the depression, an edge of the depression of the carbon-rich barrier layer closest to the drain electrode is covered with the gate electrode.

* * * * *